United States Patent
Dong

(10) Patent No.: US 7,689,388 B2
(45) Date of Patent: Mar. 30, 2010

(54) LOW COST HIGH FIDELITY SERVICE LOAD GENERATOR FOR RANDOM VIBRATION SIMULATION TESTS

(75) Inventor: Jian Dong, Irvine, CA (US)

(73) Assignee: The Boeing Company, Chicago, IL (US)

( * ) Notice: Subject to any disclaimer, the term of this patent is extended or adjusted under 35 U.S.C. 154(b) by 1602 days.

(21) Appl. No.: 10/662,065

(22) Filed: Sep. 15, 2003

(65) Prior Publication Data

US 2005/0060134 A1    Mar. 17, 2005

(51) Int. Cl.
*G06F 17/10* (2006.01)

(52) U.S. Cl. .................. 703/2; 703/1; 703/6; 703/7; 703/8

(58) Field of Classification Search ............. 307/36–39; 703/1, 2, 6, 7, 8, 14, 18
See application file for complete search history.

(56) References Cited

U.S. PATENT DOCUMENTS

| | | | | |
|---|---|---|---|---|
| 4,030,208 A | * | 6/1977 | Carver et al. | 434/46 |
| 4,633,720 A | * | 1/1987 | Dybel et al. | 73/862.53 |
| 6,212,486 B1 | * | 4/2001 | Huang et al. | 703/7 |
| 6,397,168 B1 | * | 5/2002 | Plecnik et al. | 703/2 |
| 6,591,620 B2 | * | 7/2003 | Kikuchi et al. | 62/126 |
| 6,639,982 B1 | * | 10/2003 | Stuart et al. | 379/266.03 |
| 6,928,398 B1 | * | 8/2005 | Fang et al. | 703/2 |
| 7,024,343 B2 | * | 4/2006 | El-Ratal | 703/6 |
| 7,039,536 B2 | * | 5/2006 | Nagata et al. | 702/70 |
| 7,043,102 B2 | * | 5/2006 | Okamoto et al. | 385/12 |
| 7,206,726 B2 | * | 4/2007 | Seeber et al. | 703/2 |
| 2002/0072884 A1 | * | 6/2002 | El-Ratal | 703/2 |

OTHER PUBLICATIONS

Pappas et al., "Impact of theater airlifter characteristics on future theater airlift system productivity", Proceedings of the 1992 Winter Simulation Conference, 1992.*
Crane, Francis, "Flight simulator visual-display delay compensation", 1981 Winter Simulation Conference Proceedings, IEEE, 1981.*
Christoph Leser, "On stationary fatigue load modeling using autoregressive moving average (ARMA) models", Virginia Polytechnic Institute and State Univeristy, Nov. 1993.*
Patankar et al., "State-space modeling of fatigue crack growth in ductile alloys", Elesevier Science Ltd., 2000.*
Sohn et al., "Damage diagnosis using time series analysis of vibration signals", Institute of Physics Publishing, 2001.*
Rao et al., "Auto-Regressive Time Series Modelling of Stochastic Surfaces", Department of Mechanical Engineering, Osmania University, MSM 2000.*

* cited by examiner

*Primary Examiner*—Kidest Bahta
*Assistant Examiner*—Carlos Ortiz Rodriguez
(74) *Attorney, Agent, or Firm*—Alston & Bird LLP

(57) ABSTRACT

An easy and cost-effective method of generating high fidelity simulation service loads. This invention, however, provides a simple but theoretically sound approach to conducting an accelerated simulation test, while obtaining a reasonable acceleration rate for the test. The method includes the steps of developing a service load history database; combining multiple time series models; adjusting the change of each time series model creating an accelerated service load model; regenerating a random vibration load data; and feeding the load data to drive an actuator for a high fidelity random vibration simulation test.

5 Claims, 2 Drawing Sheets

LOW COST HIGH FIDELITY SERVICE LOAD GENERATOR FOR RANDOM VIBRATION SIMULATION TESTS

CROSS REFERENCE TO RELATED APPLICATIONS

FIELD OF THE INVENTION

This invention relates to random vibration simulation tests which are widely used in aerospace, automotive, locomotive and even building industries to identify potential structural problems, and/or to verify various structure endurance and performance, etc. The present random vibration service load generator has the capability to easily and quickly reconstruct high fidelity service loads, which makes it possible to conduct highly accurate random vibration simulation tests at low cost and within a short time.

BACKGROUND OF THE INVENTION

Many techniques, approaches and systems have been established for the reconstruction of service load histories for vibration simulation tests. For example, aircraft and space launch vehicle structures must be tested under different aerodynamic and engine thrust loads, automobiles and other ground vehicles must be tested under ground and engine vibration loads. The success of a random vibration simulation test heavily depends on how accurately service loads can be produced in a laboratory. Many sophisticated and very expensive systems have been developed for these kinds of simulation tests. However, because of high cost and complexity, the usage of these systems is limited. The five commonly recognized ones are: constant amplitude load histories, programmed load histories, service duplication, random load spectrum, and remote parameter control. The service load histories generated by using the first two techniques are very inaccurate. The third technique is rarely used because the testing duration should be the same as the product service life and it also usually requires that the structure to be tested be exactly the same as the structure that is used to record the original service loads. The last two techniques require very expensive systems to generate service loads but loads generated do not fully represent the real service loads. Also, for most mechanical systems, the service life is much longer than the testing duration. Accelerated tests therefore are needed. However, with all current approaches, it is almost impossible to obtain an accurate acceleration rate when an accelerated test is conducted.

The present invention overcomes the limitations of the previous methods. With this invention, accurate service load histories can be generated and the relationship (acceleration rate) between the times for an accelerated test and for original service can be identified. A high fidelity simulation test therefore can be conducted with much less time and cost.

SUMMARY OF THE INVENTION

The present invention provides an innovative, unique, easy and cost-effective way to generate high fidelity simulation service loads, and it can be easily integrated into an existing testing system to conduct a high accurate simulation test. For many fatigue and life cycle simulation tests, it is often desired to identify the acceleration rate (real life service time/testing time), so that the testing time can be transferred to an equivalent real service life span. Due to the lack of an analytical method, it is currently very difficult to determine a reasonable rate for the transfer. The method of 1). Developing service load history database; 2). Combining multiple time series models to format a service load model; 3). Adjusting the change of each time series models to create an accelerated service load model; 4). Regenerating a random vibration load data using the accelerated service load model; and 5). Feeding the load data to drive an actuator for an high fidelity random vibration simulation test. This provides a simple but theoretically sound approach to conducting an accelerated simulation test, while obtaining a reasonable acceleration rate for the test.

Other features and advantages of the present invention will be apparent from the following description in which the preferred embodiments have been set forth in conjunction with the accompanying drawings.

BRIEF DESCRIPTION OF THE DRAWINGS

The accompanying drawings, which are incorporated in and form part of the specification, illustrate an embodiment of the present invention and together with the description, serve to explain the principles of the invention. In the drawings.

Additional advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

DETAILED DESCRIPTION OF THE INVENTION

Figure 1:
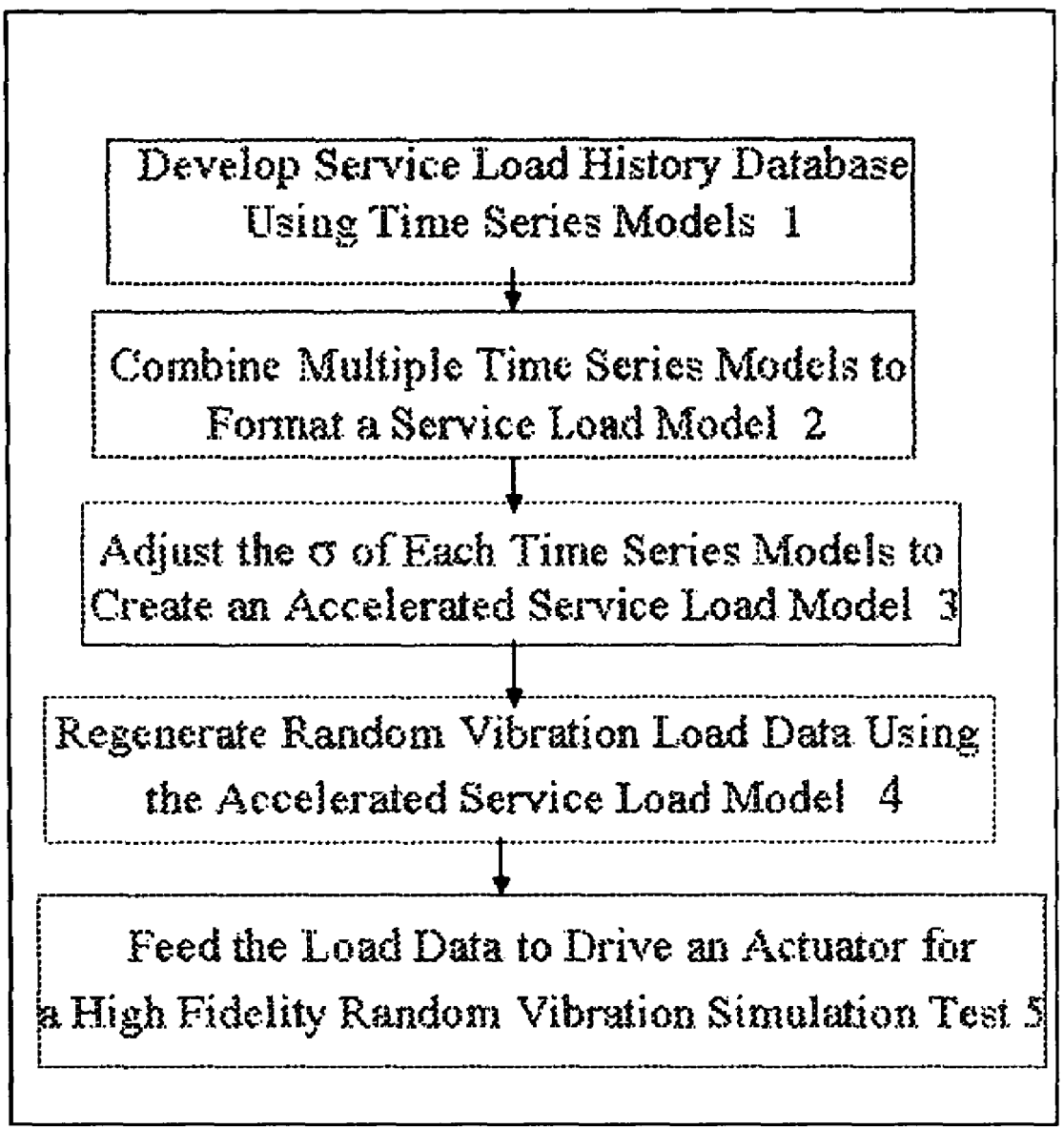
FIG. 1 a flow chart of the method.
Figure 2:
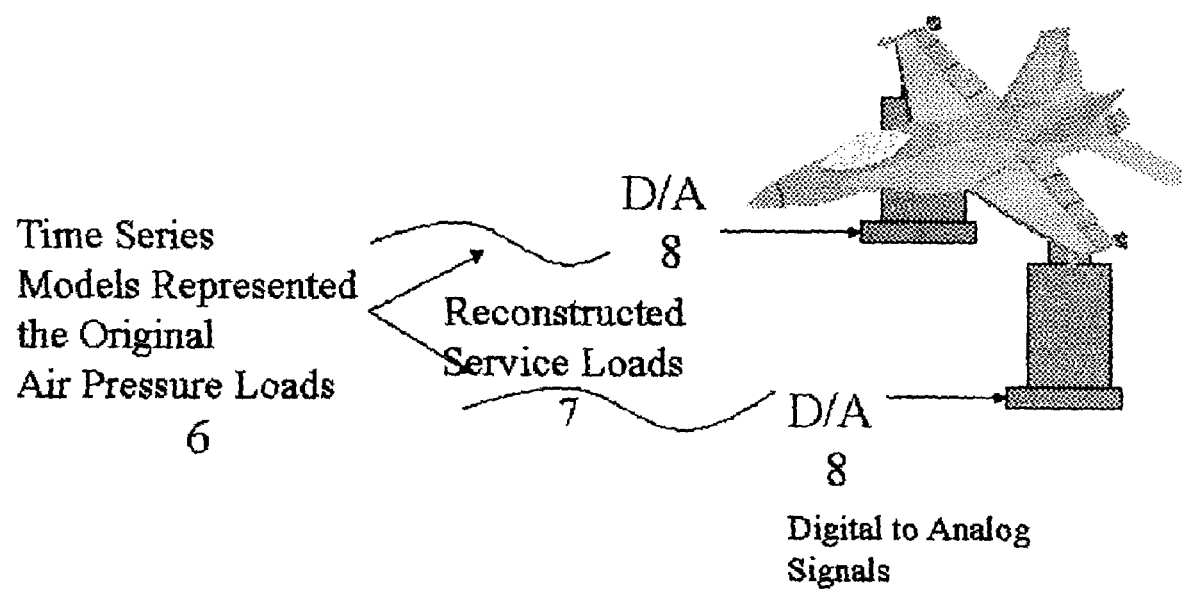
FIG. 2 depicts the method simulating wing vibrations.

The proposed high fidelity simulation test service load generator includes five innovative parts that are illustrated in FIG. 1. By integrating the proposed service load generator, a highly accurate random vibration simulation test can be done on many conventional test systems with a computer-controlled actuator. FIG. 2 shows an interpretation for using the reconstructed air pressure loads to simulate wing vibrations when an airplane is flying in the air. The reconstructed service loads can also be used to drive a computer-controlled wind tunnel to simulate air pressure fluctuations. The method provides for developing a service load history database (1). Original random vibration service loads are modeled in different time series models and stored in a computer for future reconstruction of service loads. The time series model used here is the Autoregressive Moving Average (ARMA) model. An ARMA (n,m) model can be expressed as the following:

$$X_t = \phi_1 x_{t-1} + \phi_2 x_{t-2} + \ldots + \phi_n x_{t-n} - \phi_1 a_{t-1} - \ldots - \phi_m a_{t-m} + a_t \quad (1)$$

Where, $\phi_i (i=1,\ldots,n)$ and $\phi_j (j=1,\ldots,m)$ are the parameters of the model. $a_t$ is a random variable with mean zero and variance $\sigma^2_a$, $a_t \sim NID(0, \sigma^2_a)$. $NID(0, \sigma^{2a})$ denotes Normally Independent Distributions with mean value 0 and standard deviation of $\sigma_a$. Since AR(p) models are good approximations to the ARMA(n,m) models when $p(i=1,2\ldots)$ is properly selected, and building an AR(p) model is much easier than building an ARMA(n,m) model, in practical application, AR(p) models are often used. An AR(p) model can be written as follows:

$$X_t = \phi_1 X_{t-1} + \phi_2 X_{t-2} + \ldots + \phi_n X_{t-p} + a_t \quad (2)$$

$$a_t \sim NID(0, \sigma^2_a)$$

The autospectrum of the AR(p) model is:

$$f(\omega) = \frac{\Delta \sigma_a^2}{2\pi} \frac{1}{|e^{ni\omega\Delta} - \phi_1 e^{(n-1)i\omega\Delta} - \ldots - \phi_n|^2}, -\frac{\pi}{\Delta} \leq \omega \leq \frac{\pi}{\Delta}.$$

In order to reconstruct random service load histories, an AR(p) model must be built based on original service loads which could be the data recorded in the field. For example, the service loads created by road surface fluctuations, or the service loads caused by the fluctuations of wind pressures (gusts), etc. The least square method can be used to determine all the model parameters. There are many advantages of using AR (p) to model service loads. One of them are that the service load intrinsic information, such as sequencing, amplitude, correlation and autospectrum, is included in the model, which makes regenerate high fidelity service loads for simulation tests possible. Also, because each model is represented in the AR(p) model with several parameters ($\phi_{1(1=1\ldots p)}$, $\sigma$) it requires very little memory to store them. Only one AR(p) model is needed to represent one type of service condition. For example, for the ground vehicle random vibration, soil ground and concrete ground can be represented in two AR(p) models. The model can be built on-line directly from sensors that pick up the service loads or off-line from a tape.

Step 2, combining multiple time series models to format a simulation test service load model (2). A complete simulation test service load model may contain a number of different AR(p) models that represent different service loads. The proportions of each service load will depend on the estimated time under each service load during the lifetime of the testing object, if the simulation test is to verify the life span of the testing object. For example, if the testing object is a ground vehicle, the overall simulation test loads may contain AR(p) models that represent sand road, concrete road, soil road and/or asphalt road conditions etc.

Step 3, adjust the change of each time series models to create an accelerated service load model (3). Amplitudes of the reconstructed signals can be adjusted by changing the value of $\sigma^2_a$. The adjustment does not cause a change of sequencing and the shape of the autospectrum of the reconstructed signals. For ground vehicles, the variations of $\sigma^2_a$ actually indicate the change of vehicle speed v in a real situation.

Step 4, regenerating a random vibration load data using the accelerated service load model (4). To reconstruct service load histories based on the model, the following approach is used. First, a series of random data at ($a_1, a_2 \ldots$) is generated using a random function generator based on $a_t \sim (0, \sigma^2_a)$. Then the service load is reconstructed based on the following recursive formula.

$x_1 = a_1$ $x_2 = \phi_1 x_1 + a_2$ $x_3 = \phi_1 x_2 + \phi_2 x_1 + a_3$

. . .

$x_p = \phi_1 x_{p-1} + \phi_2 x_{p-2} + \ldots + \phi_{p-1} x_1 + a_p$ $x_{p+1} = \phi_1 x_p + \phi_2 x_{p-1} + \ldots + \phi_p x_1 + a_{p+1}$

. . .

$x_n = \phi_1 x_{n-1} + \phi_2 x_{n-2} + \ldots + \phi_{n-1} x_1 + a_n$ n can be any integer number that is greater than p. Data $X_i(i=1\ldots)$ are the reconstructed service load history. Since each $X_i$ is derived from the original service load time series, both the reconstructed and original service loads have the same sequence, the same autospectrum, and the same correlation structure. During a random vibration test, the reconstructed service load can be continuously generated.

Step 5, feeding the load data to drive an actuator for a high fidelity random vibration simulation test (5). The reconstructed service loads are used to drive a computer-controlled actuator to simulate ground fluctuations, vibrations caused by propulsion systems, and/or vibrations caused by ocean waves, etc. Referring to FIG. 2, in the simulation test steps 1-3 of the time series modeling of developing history database (1) combining multiple time series models (2) and adjusting the change of each time series model (3) provides original air pressure loads are combined (6). Reconstructed service loads (7), as generated by step 4 (4) are converted from digital to analog signals and feed to actuators (8).

The embodiments of the invention in which an exclusive property or privilege is claimed are defined as follows:

1. A method of simulating service loads comprising the steps of:
   a) developing a service load history database including multiple time series models representative of different service load conditions;
   b) combining the multiple time series models to form a simulation test service load model for a time span of a testing object, wherein each time series model is included in the simulation test service load model in a proportion that is based on an estimated time within the time span for which the service load condition associated with the respective time series model will be applicable;
   c) adjusting a variance of each of the time series models of the simulation test service load model and creating an accelerated service load model;
   d) regenerating random vibration load data based upon the accelerated service load model; and
   e) feeding the random vibration load data to a drive simulation system to thereby cause the drive simulation system to simulate service loads in accordance with the random vibration load data.

2. The method as recited in claim 1 wherein said step of developing a service load history database further comprises modeling original random vibration service loads in different time series models.

3. The method as recited in claim 2 wherein said step of adjusting the variance of each of the time series models further comprises changing a value of a variance $\sigma^2 a$, where $$f(\omega) = \frac{\Delta \sigma_a^2}{2\pi} \frac{1}{|e^{ni\omega\Delta} - \phi_1 e^{(n-1)i\omega\Delta} - \ldots - \phi_n|^2}, -\frac{\pi}{\Delta} \leq \omega \leq \frac{\pi}{\Delta}.$$

wherein $f(\omega)$ is an autospectrum of the time series model for a sampling interval $\Delta$ as a function of angular frequency $\omega$, and wherein $\emptyset_i$ represents poles of each of the time series models for i=1. . . n.

4. The method as recited in claim 3 wherein said step of regenerating the random vibration load data is based upon a recursive formula.

5. The method as recited in claim 4 wherein said step of feeding the load data to a drive simulation system further comprises converting a digital signal to an analog signal and transmitting said analog signal to actuators.

* * * * *